United States Patent
Takada

(10) Patent No.: US 8,816,388 B2
(45) Date of Patent: Aug. 26, 2014

(54) SEMICONDUCTOR DEVICE WITH GATE PROTECTION DIODE

(75) Inventor: Yoshiharu Takada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/408,452

(22) Filed: Feb. 29, 2012

(65) Prior Publication Data

US 2013/0062625 A1  Mar. 14, 2013

(30) Foreign Application Priority Data

Sep. 8, 2011  (JP) ................................. 2011-196485

(51) Int. Cl.
*H01L 29/66* (2006.01)
*H01L 29/80* (2006.01)
*H01L 27/082* (2006.01)

(52) U.S. Cl.
USPC ........... 257/109; 257/121; 257/570; 257/577; 257/195; 257/199; 257/256; 257/272; 257/280; 257/287

(58) Field of Classification Search
USPC ......... 257/192, 194, 263, 260, 262, 273, 288, 257/339, 342, 372, 386, 379, E27.017, 257/E27.06, E29.327–E29.329
See application file for complete search history.

(56) References Cited

U.S. PATENT DOCUMENTS

| 5,597,758 A * | 1/1997 | Heim et al. ................... 438/527 |
| 2001/0010379 A1 * | 8/2001 | Yoshida et al. ............... 257/355 |
| 2005/0263799 A1 * | 12/2005 | Nakatsuka et al. ........... 257/266 |
| 2006/0151816 A1 * | 7/2006 | Asano et al. .................. 257/275 |
| 2011/0220978 A1 | 9/2011 | Ikeda et al. |

FOREIGN PATENT DOCUMENTS

| JP | 10-135491 | 5/1998 |
| JP | 2011-187840 | 9/2011 |

OTHER PUBLICATIONS

U.S. Appl. No. 13/227,014, filed Sep. 7, 2011, Takada, et al.

* cited by examiner

*Primary Examiner* — Steven Loke
*Assistant Examiner* — Juanita B Rhodes
(74) *Attorney, Agent, or Firm* — Oblon, Spivak, McClelland, Maier & Neustadt, L.L.P.

(57) ABSTRACT

Disclosed is a semiconductor device including: a semiconductor substrate; a field effect transistor formed on the semiconductor substrate; and a diode forming area adjacent to a forming area of the field effect transistor, wherein the diode forming area is insulated from the forming area of the field effect transistor on the semiconductor substrate, the diode forming area includes an anode electrode and a cathode electrode arranged side by side in a multi-finger shape, and the anode electrode and the cathode electrode are formed in a direction different from directions of a gate electrode, a source electrode, and a drain electrode of the field effect transistor arranged side by side in a multi-finger shape.

9 Claims, 8 Drawing Sheets

SEMICONDUCTOR DEVICE WITH GATE PROTECTION DIODE

CROSS-REFERENCE TO RELATED APPLICATION

This application is based upon and claims the benefit of priority from the prior Japanese Patent application No. JP2011-196485, filed on Sep. 8, 2011; the entire contents of which are incorporated herein by reference.

FIELD

Embodiments described herein relate generally to a semiconductor device.

BACKGROUND

Wide bandgap semiconductors such as GaN, SiC, and diamond have excellent material properties for a material as a semiconductor device, such as a breakdown voltage, electron mobility, and heat conductivity in comparison with Si. Recently, research and development have been eagerly ongoing to obtain commercially available products. In particular, a high electron mobility transistor (HEMT) structure having a hetero-junction channel such as AlGaN/GaN has a high electron mobility and a high carrier density. For this reason, the GaN device has advantages such as an excellent high-frequency characteristic or a low on-resistance in comparison with the Si device and has been expected as the next-generation switching device in the field of the power electronics.

However, the GaN device having a typical AlGaN/GaN hetero-junction channel is a normally-on type in which a gate threshold voltage is negative, and the gate electrode may be easily broken down when an excessive positive voltage is applied thereto. In order to avoid such a phenomenon, a diode for clipping a gate voltage to protect the gate electrode is generally installed between the gate and the source outside the chip. As a result, the number of components in a circuit may increase, and wiring on the circuit board may become complicated.

DETAILED DESCRIPTION

Figure 1:
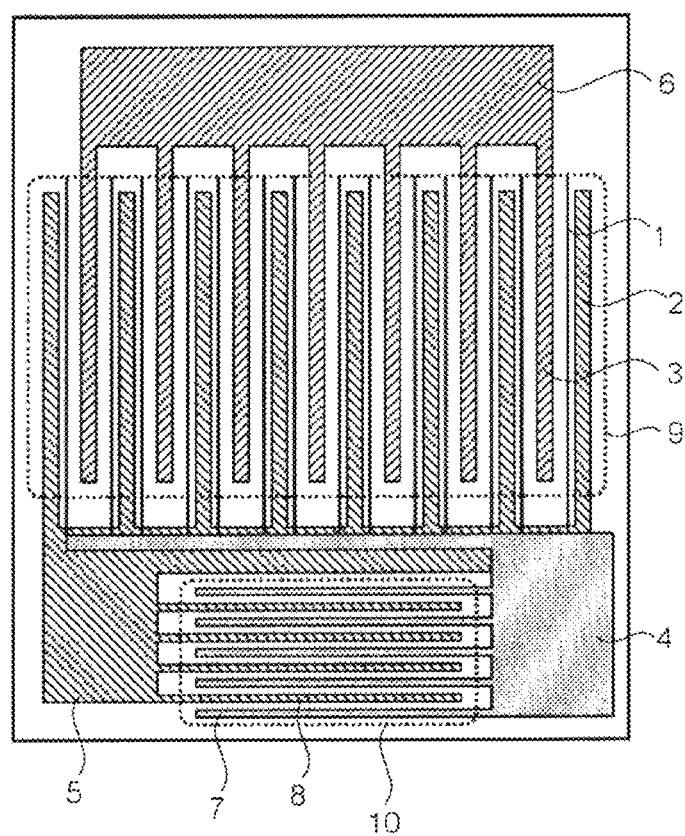
FIG. 1 is a top plan view illustrating a semiconductor device according to a first embodiment.

Embodiments described herein have been made to address such problems and an object thereof is to provide a semiconductor device excellent in area efficiency.

According to an aspect, there is provided a semiconductor device including: a semiconductor substrate; a field effect transistor formed over the semiconductor substrate; and a diode forming area adjacent to a forming area of the field effect transistor, wherein the diode forming area is insulated from the transistor forming area on the semiconductor substrate, the diode forming area includes an anode electrode and a cathode electrode arranged side by side in a multi-finger shape, and the anode electrode and the cathode electrode are formed in a direction different from directions of a gate electrode, a source electrode, and a drain electrode of the field effect transistor arranged side by side in a multi-finger shape.

As described above, in the related art, devices such as GaN having an AlGaN/GaN hetero-junction channel are a normally-on type in which the gate threshold voltage is negative, and the gate electrode may be easily broken down when an excessive positive voltage is applied thereto. Although a protection diode is provided around the gate electrode pad and the source electrode pad in order to avoid this phenomenon, it is difficult for the protection diode to obtain a current capacity for protecting the gate electrode of the field effect transistor only in this area. In addition, in a case where the protection diode is provided in the area interposed between the gate electrode bus line and the source electrode pad or the source electrode bus line, a wiring structure provided to form the protection diode becomes complicated, and it is difficult to obtain a safe operation. In the aforementioned layout, the overhanging gate electrode pad generates an unnecessary area on the chip where no device is formed. This increases the on-resistance of the chip and the cost.

Embodiments described herein have been made to address such problems and provide a layout of the gate electrode protection diode within the field effect transistor chip.

According to an embodiment, there is provided a semiconductor device including: a semiconductor substrate; a field effect transistor formed over the semiconductor substrate; and a diode forming area adjacent to a forming area of the field effect transistor, wherein the diode forming area is insulated from the transistor forming area on the semiconductor substrate, the diode forming area includes an anode electrode and a cathode electrode arranged side by side in a multi-finger shape, and the anode electrode and the cathode electrode are formed in a direction different from directions of a gate electrode, a source electrode, and a drain electrode of the field effect transistor arranged side by side in a multi-finger shape.

Since the anode electrode is connected to the gate electrode pad, and the cathode electrode is connected to the source electrode, the source electrode bus line is interposed between the field effect transistor forming area and the protection diode forming area. Therefore, a safe operation and a current amount necessary in the protection diode can be obtained. When the field effect transistor and the protection diode are laid out on a single chip, the unnecessary area can be removed.

Furthermore, a plurality of field effect transistors and a plurality of first diodes are arranged in a folded symmetrical multi-finger shape. Therefore, various rated current requirements or breakdown voltage requirements in the switching devices used in the field of power supplies of the power electronics can be met and a semiconductor device can be formed on a small chip without an unnecessary area.

Next, embodiments will be described in more detail with reference to the accompanying drawings.

First Embodiment

Figure 2:
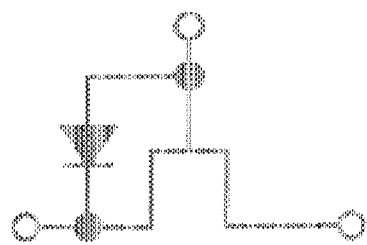
FIG. 2 is a circuit diagram illustrating the semiconductor device according to the first embodiment.

A configuration of the semiconductor device according to a first embodiment will be described with reference to the drawings. FIG. 1 is a top plan view illustrating the semiconductor device according to the first embodiment, and FIG. 2 is a circuit diagram illustrating the semiconductor device according to the first embodiment.

In the semiconductor device according to the first embodiment, a field effect transistor and a diode for protecting the gate electrode of the field effect transistor are formed on the same semiconductor substrate (on a single chip).

The field effect transistor is configured in a transistor forming area 9 on the semiconductor substrate, and the diode is configured in a diode forming area 10 on the semiconductor substrate. The transistor forming area 9 and the diode forming area 10 are electrically insulated from each other on the semiconductor substrate by performing mesa isolation or ion implantation for the semiconductor substrate.

The field effect transistor of the first embodiment is a normally-on type AlGaN/GaN-HEMT having an insulated gate structure, and a combination of a gate electrode 1, a source electrode 2, and a drain electrode 3 is arranged in a folded symmetrical multi-finger shape. The gate electrode of the field effect transistor is connected to the gate electrode bus line which binds the gate electrode 1, the source electrode 2, and the drain electrode 3. The drain electrode is connected to a drain electrode pad 6 which binds the gate electrode 1, the source electrode 2, and the drain electrode 3. The gate electrode bus line is connected to a gate electrode pad 4, and the source electrode bus line is connected to a source electrode pad 5. A protection diode 10 of the gate electrode is provided in an area between the gate electrode pad 4 and the source electrode pad 5 arranged to face each other.

In the protection diode 10, the combination of an anode electrode 7 and a cathode electrode 8 are repeatedly arranged in a multi-finger shape on the area electrically insulated from the field effect transistor forming area 9. A group of anode electrodes is connected to the gate electrode pad 4, and a group of cathode electrodes is connected to the source electrode pad 5. The directions of the anode electrode 7 and the cathode electrode 8 formed in the multi-finger shape have angles different from those of the installation directions of the gate electrode 1, the source electrode 2, and the drain electrode 3 included in the field effect transistor in a multi-finger shape.

In FIG. 1, the gate electrode bus line is arranged to be overlapped and covered with the source pad 5 and the source electrode bus line. As a result, the gate electrode can be protected from a high electric field applied between the gate electrode and the drain electrode of the transistor.

Although the semiconductor device of FIG. 1 is illustrated as an example in which the directions of the anode electrode 7 and the cathode electrode 8 of the diode formed in a multi-finger shape are perpendicular to the installation directions of the gate electrode 1, the source electrode 2, and the drain electrode 3 having a multi-finger shape of the field effect transistor, such installation directions are not necessarily perpendicular, and may arbitrarily be selected as long as they are not identical to each other. However, the perpendicular arrangement is preferable because the arrangement area can be minimized.

If the installation directions are identical, and the electrode direction of the diode is positioned in parallel with the electrode direction of the transistor, the arrangement of a gate (=anode) pad and a source (=cathode) pad becomes complicated. For example, if the gate (=anode) pad is provided between the transistor and the diode, and the source (=cathode) pad is arranged under the diode, the distance from the source electrode of the transistor to the source (=cathode) pad increases in comparison with the semiconductor device of the present embodiment, so that a parasitic component may increase, and there is a disadvantage in the switching speed improvement.

Second Embodiment

Figure 3:
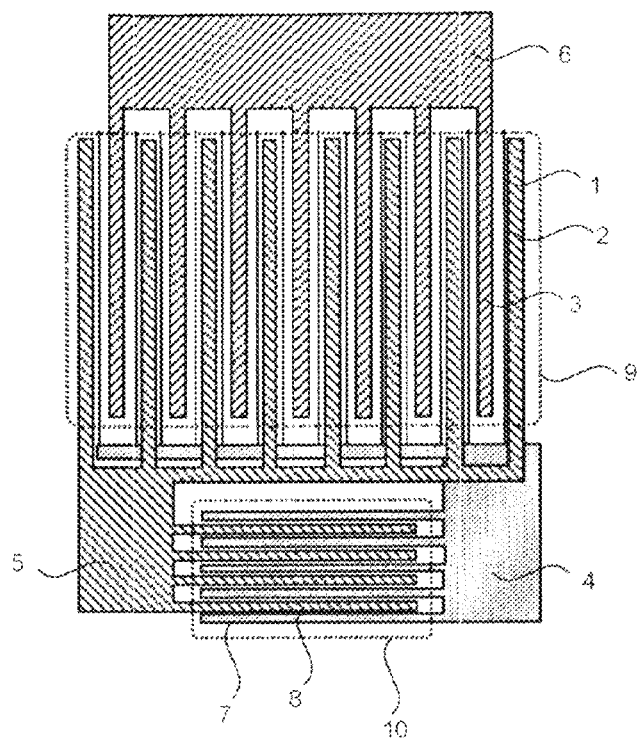
FIG. 3 is a top plan view illustrating a semiconductor device according to a second embodiment.

Referring to the top plan view of the semiconductor device of FIG. 3, the positional relation of the gate electrode bus line and the source electrode bus line is changed to reduce parasitic capacitance between the bus lines in comparison with the first embodiment.

According to the present embodiment, a semiconductor device suitable for the high speed switching can be obtained by reducing a turn-on time or turn-off time of the switching characteristic because the parasitic capacitance between the bus lines is reduced.

Third Embodiment

Figure 4:
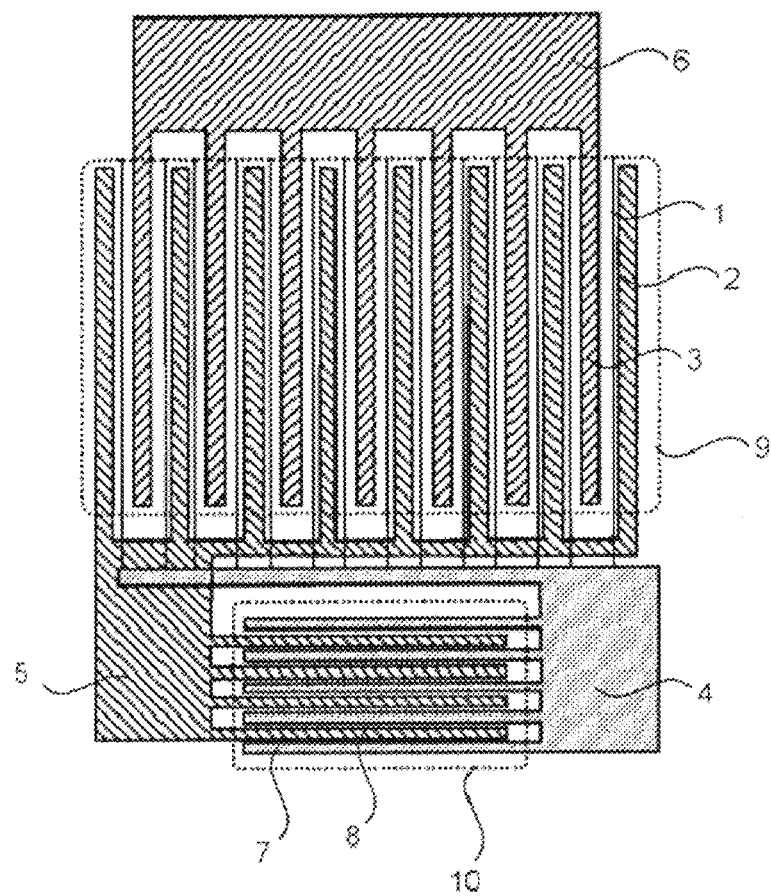
FIG. 4 is a top plan view illustrating a semiconductor device according to a third embodiment.

Referring to the top plan view of the semiconductor device illustrated in FIG. 4, the positional relation between the gate electrode bus line and the source electrode bus line is changed to reduce parasitic capacitance between the bus lines in comparison with the first embodiment.

In the semiconductor device according to the present embodiment, the parasitic capacitance between the bus lines is reduced, and a structure suitable for the high speed switching is provided. In addition, since the source electrode bus line is arranged between the gate electrode bus line and the drain electrode, the possibility of device breakdown between the gate electrode bus line and the drain electrode is lowered, and a semiconductor device capable of providing a high breakdown voltage operation is obtained in comparison with the semiconductor device of the second embodiment.

Fourth Embodiment

Figure 5:
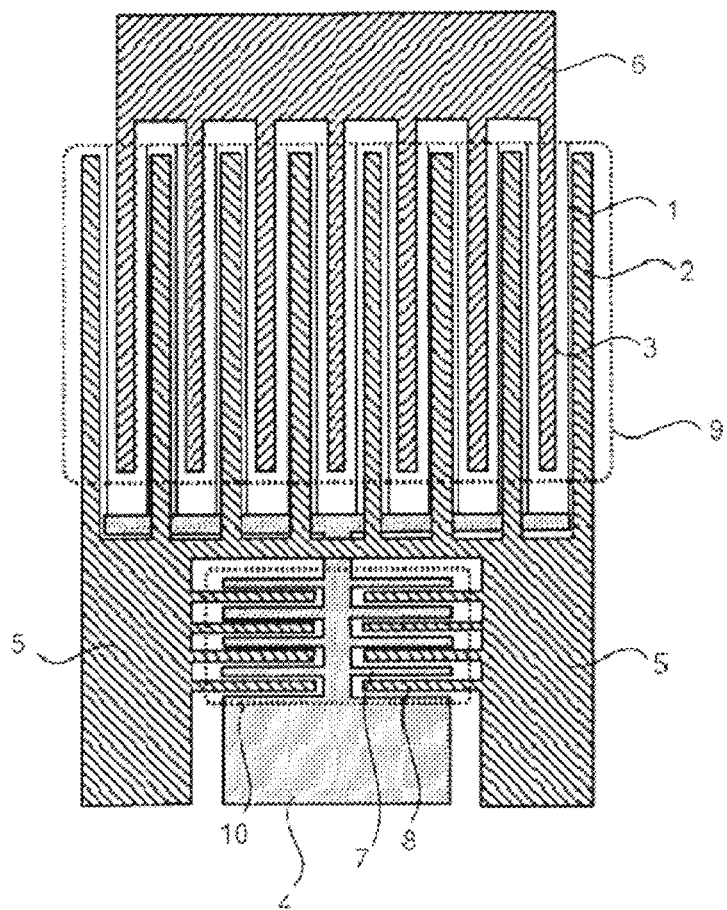
FIG. 5 is a top plan view illustrating a semiconductor device according to a fourth embodiment.

Referring to the top plan view of the semiconductor device of FIG. 5, the number of lines that can be bonded to the source electrode pad increases.

In this semiconductor device, grounding can be reinforced and a distance difference from the gate electrode finger and the gate electrode pad to each gate electrode can be suppressed at minimum so that a stable operation can be implemented.

Fifth Embodiment

Figure 6:
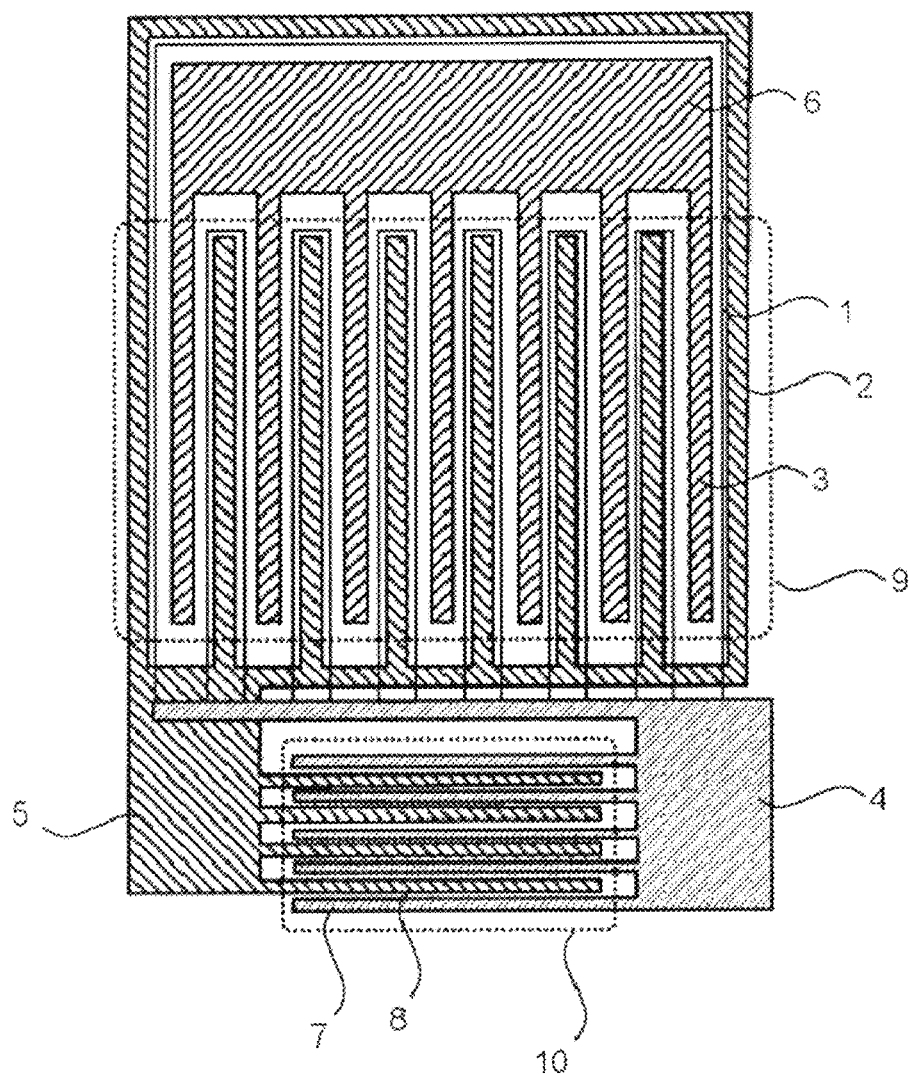
FIG. 6 is a circuit diagram illustrating a semiconductor device according to a fifth embodiment.

Referring to the top plan view of the semiconductor device illustrated in FIG. 6, in order to obtain a safe operation of the field effect transistor, the drain electrode pad is shielded by a line of the same electric potential as those of the gate electrode and the source electrode. As a result, all points within the semiconductor device are formed without affecting the positional relation between the drain electrode, the gate electrode, and the source electrode. Therefore, a high breakdown voltage operation can be implemented since a structurally discontinuous point that can be easily broken down in a high voltage operation is removed.

Sixth Embodiment

Figure 7:
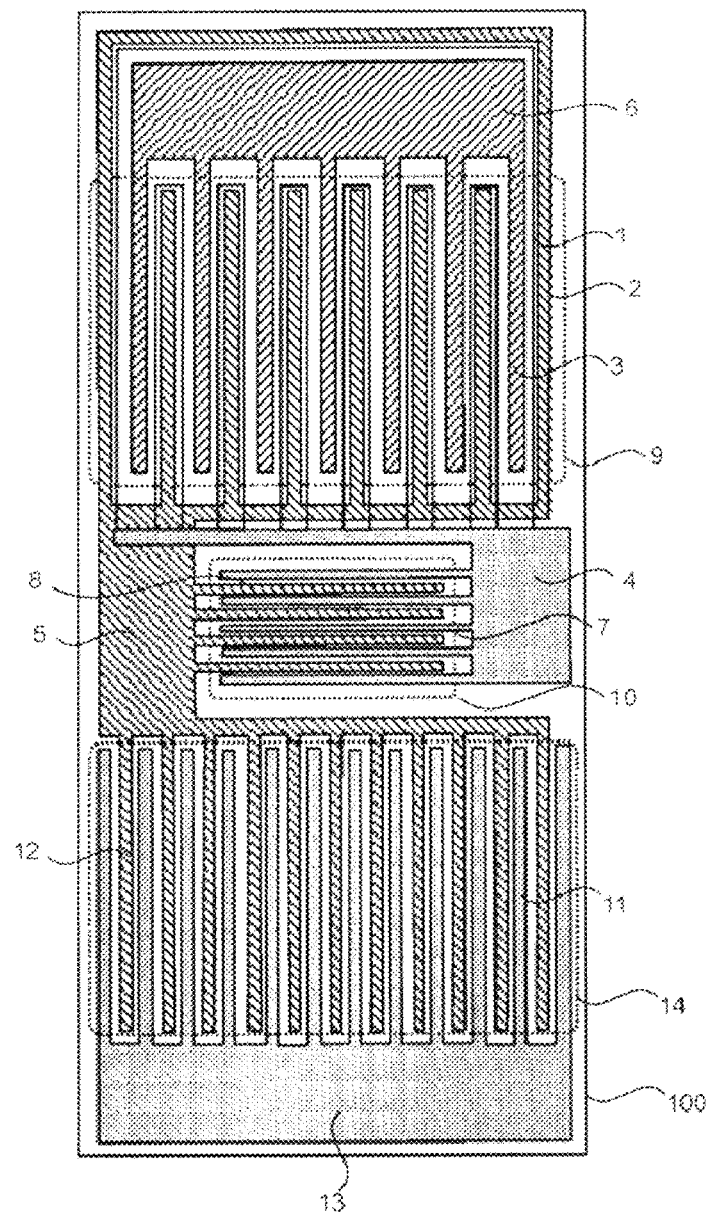
FIG. 7 is a circuit diagram illustrating a semiconductor device according to a sixth embodiment.
Figure 8:
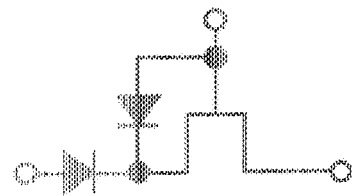
FIG. 8 is a circuit diagram illustrating the semiconductor device according to the sixth embodiment.
Figure 9:
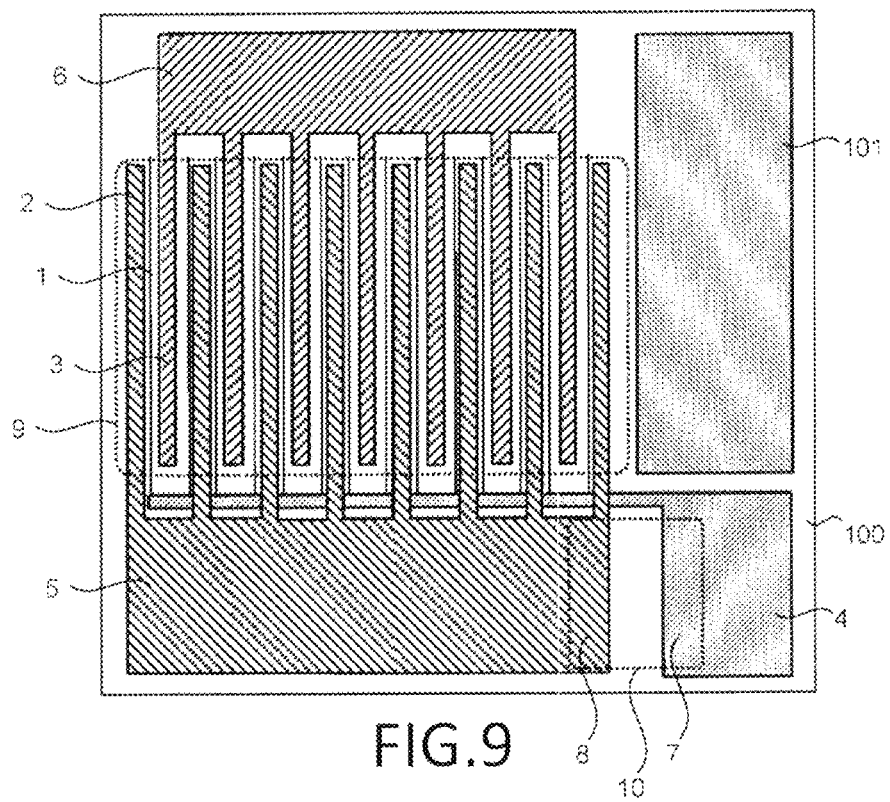
FIG. 9 is a top plan view illustrating a semiconductor device of the related art.
Figure 10:
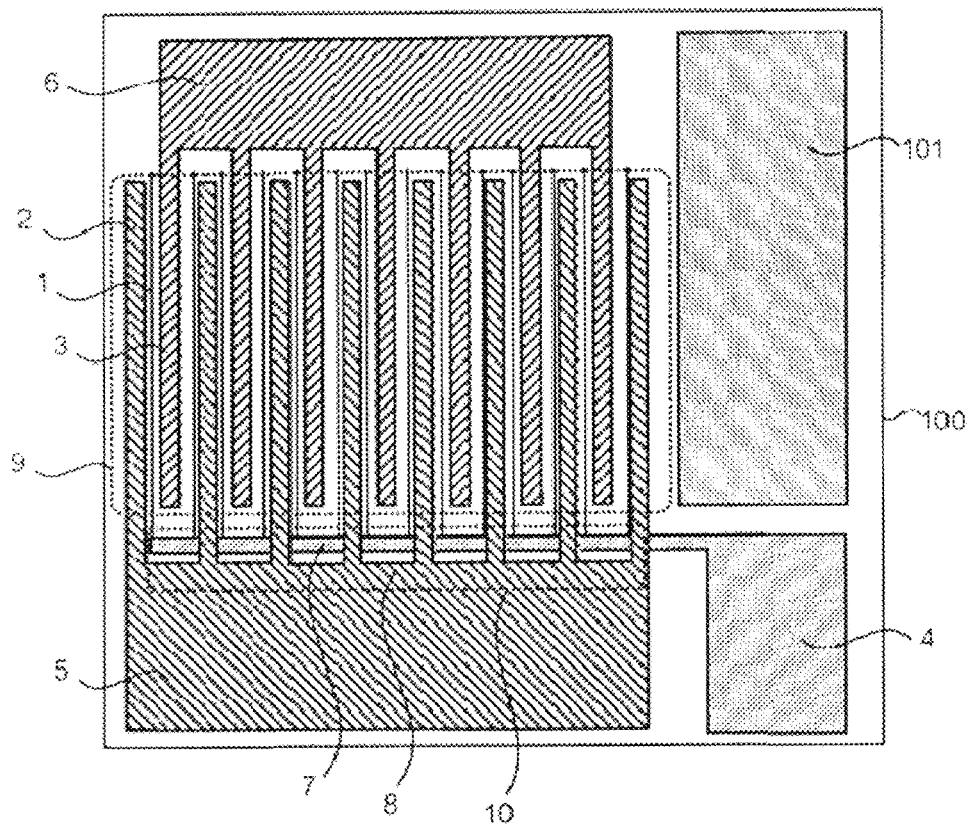
FIG. 10 is a top plan view illustrating a semiconductor device of the related art.

Referring to the top plan view of the semiconductor device of FIG. 7, a free-wheeling diode is connected to the field effect transistor having the gate electrode protection diode described in the fifth embodiment, and devices are laid out in a single chip. FIG. 8 is a circuit diagram illustrating the semiconductor device according to the sixth embodiment. The field effect transistor is arranged to face the free-wheeling diode through the protection diode. The anode electrode and the cathode electrode of the protection diode, formed in a multi-finger shape, interposed between the field effect transistor and the free-wheeling diode are straightly elongated relative to the electrode direction of the field effect transistor and the free-wheeling diode formed in a multi-finger shape. As a result, a breakdown voltage can be secured between each device. Since the anode electrode pad of the free-wheeling diode and the drain electrode pad of the field effect transistor generating a high voltage difference can be arranged in both ends of the chip, a safe chip operation can be obtained. The anode electrode pad of the free-wheeling diode, the field effect transistor, the gate electrode protection diode, and the free-wheeling diode can be integrated into a single chip without generating an unnecessary area. Since the chip periphery has a rectangular shape, an unnecessary area is not generated when it is cut out from a wafer, and the cost can be effectively reduced.

Although the AlGaN/GaN-HEMT is used in the present embodiment, the field effect transistor is not limited to the AlGaN/GaN-HEMT. Similar effects can be obtained using a field effect transistor made of a nitride semiconductor containing AlInGaN, InGaN, or AlN, or a field effect transistor containing SiC, GaAs, InP, InGaAs, or InGaP.

The drawings used to illustrate the semiconductor device are all conceptual, and the number of gate electrodes in the drawings is arbitrarily selected for convenience purposes. In order to meet a large current requirement, a large-scaled chip can be manufactured by symmetrically or repeatedly connecting the layout of the semiconductor device provided in the embodiment.

Although some embodiments have been described hereinbefore, those embodiments are just exemplary and are not intended to limit the scope of the invention. Such embodiments may be embodied in various other forms, and various omissions, substitutions, or changes may be possible without departing from the spirit and scope of the invention. For example, constituent elements in different embodiments may appropriately be combined. Such embodiments and modifications are construed to encompass the scope of the invention and equivalents thereof if they are similarly included in the scope or subject matter of the invention.

What is claimed is:

1. A semiconductor device comprising:
   a semiconductor substrate;
   a field effect transistor formed on the semiconductor substrate; and
   a first diode forming area adjacent to a forming area of the field effect transistor,
   wherein the first diode forming area is insulated from the forming area of the field effect transistor on the semiconductor substrate, and
   an electrode of a first diode in the first diode forming area is formed in a direction different from a direction of an electrode of the field effect transistor, and formed in a comb shape.

2. A semiconductor device comprising:
   a semiconductor substrate;
   a field effect transistor formed on the semiconductor substrate;
   a first diode forming area adjacent to a forming area of the field effect transistor; and
   a second diode forming area adjacent to the first diode forming area,
   wherein the first diode forming area and the second diode forming area are insulated from the forming area of the field effect transistor on the semiconductor substrate, and
   an electrode of a first diode in the first diode forming area is formed in a direction different from a direction of an electrode of the field effect transistor and a direction of an electrode of a second diode, and is formed in a comb shape.

3. The semiconductor device according to claim 1, wherein a plurality of the field effect transistors and a plurality of the first diodes are arranged in a folded symmetrical multi-finger shape.

4. The semiconductor device according to claim 2, wherein a plurality of the field effect transistors, a plurality of the first diodes, and a plurality of the second diodes are arranged in a folded symmetrical multi-finger shape.

5. The semiconductor device according to claim 1, wherein the first diode is formed in an area interposed between a gate electrode pad and a source electrode pad of the field effect transistor, an anode electrode of the first diode is connected to the gate electrode pad of the field effect transistor, and a cathode electrode of the first diode is connected to the source electrode pad of the field effect transistor.

6. The semiconductor device according to claim 2, wherein the first diode is formed in an area interposed between a gate electrode pad and a source electrode pad of the field effect transistor,
an anode electrode of the first diode is connected to the gate electrode pad of the field effect transistor,
a cathode electrode of the first diode is connected to the source electrode pad of the field effect transistor, and
a cathode electrode of the second diode is connected to the source electrode pad of the field effect transistor.

7. The semiconductor device according to claim 3, wherein the first diode is formed in an area interposed between a gate electrode pad and a source electrode pad of the field effect transistor, an anode electrode of the first diode is connected to the gate electrode pad of the field effect transistor, and a cathode electrode of the first diode is connected to the source electrode pad of the field effect transistor.

8. The semiconductor device according to claim 4, wherein the first diode is formed in an area interposed between a gate electrode pad and a source electrode pad of the field effect transistor,
an anode electrode of the first diode is connected to the gate electrode pad of the field effect transistor,
a cathode electrode of the first diode is connected to the source electrode pad of the field effect transistor, and
a cathode electrode of the second diode is connected to the source electrode pad of the field effect transistor.

9. The semiconductor device according to claim 1, wherein the field effect transistor contains any of AlGaN/GaN, AlInGaN, InGaN, AlN, SiC, GaAs, InP, InGaAs, or InGaP.

* * * * *